(12) United States Patent
Jung

(10) Patent No.: US 12,123,918 B2
(45) Date of Patent: Oct. 22, 2024

(54) CIRCUIT DIAGNOSING APPARATUS AND BATTERY PACK INCLUDING THE SAME

(71) Applicant: LG Energy Solution, Ltd., Seoul (KR)

(72) Inventor: Geon Jung, Daejeon (KR)

(73) Assignee: LG Energy Solution, Ltd., Seoul (KR)

(*) Notice: Subject to any disclaimer, the term of this patent is extended or adjusted under 35 U.S.C. 154(b) by 552 days.

(21) Appl. No.: 17/604,930

(22) PCT Filed: Nov. 26, 2020

(86) PCT No.: PCT/KR2020/016897
§ 371 (c)(1),
(2) Date: Oct. 19, 2021

(87) PCT Pub. No.: WO2021/107627
PCT Pub. Date: Jun. 3, 2021

(65) Prior Publication Data
US 2022/0179005 A1    Jun. 9, 2022

(30) Foreign Application Priority Data

Nov. 26, 2019   (KR) .......................... 10-2019-0153700

(51) Int. Cl.
*G01R 31/385* (2019.01)
*H01M 10/42* (2006.01)
*H01M 10/48* (2006.01)

(52) U.S. Cl.
CPC ...... *G01R 31/385* (2019.01); *H01M 10/4257* (2013.01); *H01M 10/48* (2013.01)

(58) Field of Classification Search
CPC ............... G01R 31/385; G01R 29/027; G01R 31/3835; G01R 31/50; G01R 31/396;
(Continued)

(56) References Cited

U.S. PATENT DOCUMENTS 4,914,315 A * 4/1990 Nickolai .............. H01H 47/002
361/170
2004/0145348 A1   7/2004 Bucur et al.
(Continued)

FOREIGN PATENT DOCUMENTS

EP    623943 A1 * 11/1994 ........... H01H 47/002
JP    6473246 B2    2/2019
(Continued)

OTHER PUBLICATIONS

International Search Report for Application No. PCT/KR2020/016897 dated Aug. 24, 2020, 3 pgs.
(Continued)

*Primary Examiner* — Daniel R Miller
(74) *Attorney, Agent, or Firm* — Lerner David LLP

(57) ABSTRACT

A circuit diagnosing apparatus diagnoses a circuit state of a battery pack including a battery cell and a main relay connected in series, and includes: a control unit configured to output a first signal having a preset duty cycle through a first line connected to the main relay according to a predetermined output frequency; and a DC-DC converter further connected to the first line to receive the first signal through the first line and configured to receive a second signal output from the battery cell whenever an operation state of the main relay is shifted to a turn-on state by the first signal, convert the first signal and the second signal, and transmit a first conversion signal and a second conversion signal obtained by the conversion to the control unit.

12 Claims, 3 Drawing Sheets

(58) Field of Classification Search
CPC ............... G01R 23/005; G01R 31/392; H01M 10/4257; H01M 10/48; H02J 7/0047; H02J 7/0025; H02J 7/0029; H02J 7/005; H02J 7/0068; H02J 7/007; H02H 7/18
See application file for complete search history.

(56) References Cited

U.S. PATENT DOCUMENTS

| | | | |
|---|---|---|---|
| 2013/0116875 A1* | 5/2013 | Oh | B60L 53/14 701/22 |
| 2013/0320986 A1 | 12/2013 | Shiraishi et al. | |
| 2014/0003107 A1 | 1/2014 | Lee et al. | |
| 2018/0113170 A1* | 4/2018 | Liu | G01R 31/327 |
| 2018/0188326 A1 | 7/2018 | Huh et al. | |
| 2018/0323025 A1 | 11/2018 | Katrak et al. | |
| 2018/0334037 A1 | 11/2018 | Masui et al. | |
| 2019/0044198 A1 | 2/2019 | Kuroda et al. | |
| 2019/0379217 A1 | 12/2019 | Song et al. | |

FOREIGN PATENT DOCUMENTS

| | | |
|---|---|---|
| KR | 100677966 B1 | 2/2007 |
| KR | 100867834 B1 | 11/2008 |
| KR | 20120081825 A | 7/2012 |
| KR | 101204512 B1 | 11/2012 |
| KR | 101350684 B1 | 1/2014 |
| KR | 20140020765 A | 2/2014 |
| KR | 20170060672 A | 6/2017 |
| KR | 20170098049 A | 8/2017 |
| KR | 20180042755 A | 4/2018 |
| KR | 20180122557 A | 11/2018 |
| KR | 20190034888 A | 4/2019 |

OTHER PUBLICATIONS

Extended European Search Report for Application No. 20894276.3 dated Jul. 28, 2022, pp. 1-5.

* cited by examiner

CIRCUIT DIAGNOSING APPARATUS AND BATTERY PACK INCLUDING THE SAME

CROSS-REFERENCE TO RELATED APPLICATIONS

The present application is a national phase entry under 35 U.S.C. § 371 of International Application No. PCT/KR2020/016897 filed Nov. 26, 2020, published in Korean, which claims priority from Korean Patent Application No. 10-2019-0153700 filed Nov. 26, 2019, all of which are incorporated herein by reference.

TECHNICAL FIELD

The present disclosure relates to a circuit diagnosing apparatus and a battery pack including the same, and more particularly, to a circuit diagnosing apparatus for determining whether a defect occurs at a battery pack based on signal conversion using a DC-DC converter, and a battery pack including the same.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

The battery pack equipped with such a battery is connected to a device such as the electronic product, the electric vehicle and the energy storage battery, and serves to connect the battery and the device.

FIG. 1 is a diagram schematically showing a first comparative example. Specifically, FIG. 1 is a diagram showing an exemplary configuration of a conventional battery pack connected to a load.

Referring to FIG. 1, a battery pack of the first comparative example includes a battery B, a main switch SW, a micro controller unit (MCU), and a high side driver integrated circuit (HSD IC), and may be connected to a load.

The MCU may output a control signal to the HSD IC through a La line. For example, the control signal may be a pulse width modulation (PWM) signal. In addition, the HSD IC may output a control signal corresponding to the received PWM signal to the main switch SW through a Lb line. The operation state of the main switch SW receiving the control signal is converted to a turn-on state, so that the current output from the battery B may flow to the load. At this time, the HSD IC may measure one end voltage of the main switch SW through an Lc line and measure the other end voltage of the main switch SW through an Ld line. In addition, the HSD IC may determine whether a defect occurs at the battery pack by calculating the difference between the measured one end voltage and the other end voltage of the main switch SW.

For example, if Short To Ground (STG) occurs between the main switch SW and the load, the HSD IC may measure the other end voltage of the main switch SW as 0 [V] through the Ld line. In this case, since the one end voltage of the main switch SW measured through the Lc line and the other end voltage of the main switch SW measured through the Ld line are different from each other, the HSD IC may determine that a defect occurs at the battery pack.

However, the HSD IC may be operated only when receiving a PWM signal from the MCU. That is, the PWM signal output from the MCU may be a wake-up signal for driving the HSD IC.

In addition, in general, the HSD IC may be designed to diagnose whether a defect occurs at the battery pack when a predetermined time elapses after receiving a signal from the MCU in order to secure stability. As such, the time from a time point when the HSD IC receives a signal from the MCU to a time point when it is diagnosed that a defect occurs at the battery pack is called a blank time. That is, the blank time refers to the time taken until the HSD IC is actually driven after receiving the driving signal. The blank time will be described in more detail with reference to FIG. 2.

FIG. 2 is a diagram showing an example of the blank time of the HSD IC in the battery pack of the first comparative example.

Referring to FIGS. 2, at t1, t3 and t5, the HSD IC receives a control signal from the MCU, and the time from t1, t3 and t5 to tB may be the blank time. The HSD IC has a problem that it is not possible to determine whether a defect occurs at the battery pack at this blank time. That is, in FIG. 2, the HSD IC may determine whether a defect occurs at the battery pack only in time points other than the blank time.

For example, in FIG. 1, it is assumed that a short occurs at a line between the main switch SW and the load in the blank time of the HSD IC. In this case, the voltage at one end of the main switch SW and the voltage at the other end of the main switch SW may be different. For example, the voltage at one end of the main switch SW may be the same as the voltage of the battery B, and the voltage at the other end of the main switch SW may be 0 [V]. However, since the short occurs during the blank time of the HSD IC, the HSD IC has a fatal problem that it cannot diagnose whether a defect occurs at the battery pack.

SUMMARY

Technical Problem

The present disclosure is designed to solve the problems of the related art, and therefore the present disclosure is directed to providing a circuit diagnosing apparatus, which may determine whether a defect occurs at a battery pack without using a HSD IC.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a circuit diagnosing apparatus for diagnosing a battery pack including a battery cell and a main relay connected in series, the circuit diagnosing apparatus comprising: a control unit configured to output a first signal of a preset duty cycle through a first line connected to the main relay; and a DC-DC converter, connected to the first line, configured to receive the first signal through the first line, receive a second signal output from the battery cell in response to the first signal changing an operation state of the main relay to a turn-on state; convert the first signal and the second signal, and transmit a first conversion signal and a second conversion signal obtained by the conversion to the control unit.

The control unit may be configured to receive the first conversion signal and the second conversion signal from the DC-DC converter, determine whether the first conversion signal and the second conversion signal include one or more common signal properties, and determine whether the battery pack has a defect based on the determination of whether the first conversion signal and the second conversion signal include one or more common signal properties.

The DC-DC converter may be configured to convert voltage magnitudes of the first signal and the second signal to a same size.

The one or more common signal properties includes may be at least one of a duty cycle or a frequency of the first conversion signal and the second conversion signal.

The control unit may be configured to determine that the battery pack has a defect in response to the first and second conversion signals having at least one of a different duty cycle or a different frequency The control unit may be configured to: determine that the battery pack has no defect, in response to the first conversion signal and the second conversion signal having one or more common signal properties, and determine that the battery pack has a defect, in response to the first conversion signal and the second conversion signal not having one or more common signal properties.

The second signal may be output from the battery cell and input to the DC-DC converter through the main relay in response to the operation state of the main relay being changed to the turn-on state by the first signal.

The main relay may include: a first relay terminal connected to the battery cell; a second relay terminal connected to the control unit through the first line; and a third relay terminal connected to the DC-DC converter.

The DC-DC converter may include: a first input terminal connected to the first line to receive the first signal through the first line; a second input terminal connected to a second line to receive the second signal through the second line; a first output terminal connected to a third line to output the first conversion signal to the control unit through the third line; and a second output terminal connected to a fourth line to output the second conversion signal to the control unit through the fourth line.

The second line may be electrically connected to the third relay terminal.

The circuit diagnosing apparatus according to another aspect of the present disclosure may further comprise a diagnosis line connected in parallel to the battery cell; a diagnosis resistor disposed on the diagnosis line; and a diagnosis relay disposed on the diagnosis line in series with the diagnosis resistor.

The control unit may be connected to the diagnosis relay through a fifth line to control an operation state of the diagnosis relay.

The control unit may be configured to change the operation state of the diagnosis relay to a turn-on state through the fifth line and output the first signal to the main relay after changing the operation state of the diagnosis relay to the turn-on state.

The second signal may be configured to flow through the diagnosis line when the operation states of the diagnosis relay and the main relay are in the turn-on state.

A battery pack according to another aspect of the present disclosure may comprise the circuit diagnosing apparatus according to any embodiment described herein.

Advantageous Effects

According to an aspect of the present disclosure, the circuit diagnosing apparatus has an advantage of more objectively and accurately determining whether a defect occurs at a battery pack by comparing signals output from different subjects.

In addition, according to an aspect of the present disclosure, since the circuit diagnosing apparatus converts the intensities of a first signal and a second signal of different output subjects equally through a DC-DC converter, when determining whether a first conversion signal and a second conversion signal are the same, there is an advantage of minimizing the effect of signal intensity.

The effects of the present disclosure are not limited to the above, and other effects not mentioned herein will be clearly understood by those skilled in the art from the appended claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 3:
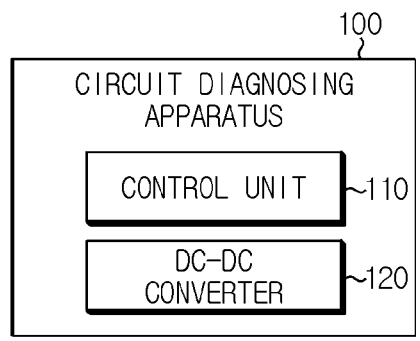
FIG. 3 is a diagram schematically showing a circuit diagnosing apparatus according to an embodiment of the present disclosure.
Figure 4:
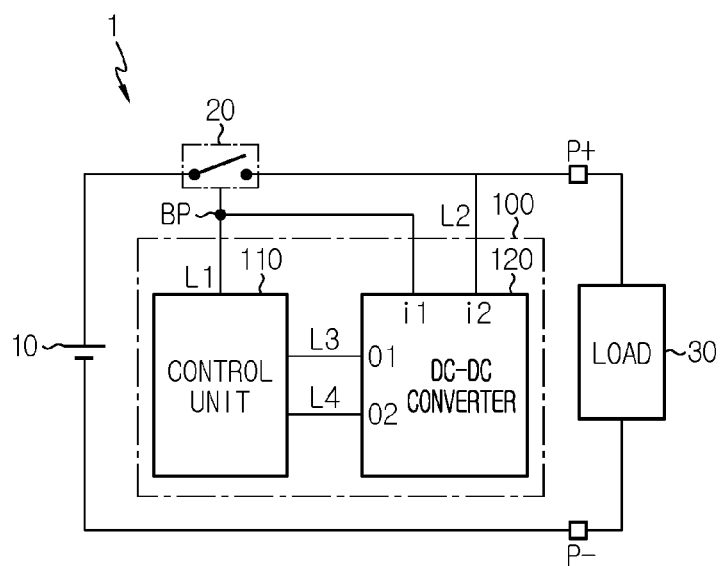
FIG. 4 is a diagram showing an exemplary configuration of a battery pack including the circuit diagnosing apparatus according to an embodiment of the present disclosure.

FIG. 3 is a diagram schematically showing a circuit diagnosing apparatus 100 according to an embodiment of the present disclosure. FIG. 4 is a diagram showing an exemplary configuration of a battery pack 1 including the circuit diagnosing apparatus 100 according to an embodiment of the present disclosure.

Referring to FIG. 4, the battery pack 1 may include a battery cell 10, a main relay 20, and a circuit diagnosing apparatus 100. In addition, a load 30 may be connected to a positive electrode terminal P+ of the battery pack 1 and a negative electrode terminal P− of the battery pack 1.

Here, the battery cell 10 refers to one independent cell that includes a negative electrode terminal and a positive electrode terminal and is physically separable. For example, one pouch-type lithium polymer cell may be regarded as the battery cell 10. In addition, the battery pack 1 may include one or more battery modules in which one or more battery cells 10 are connected in series and/or in parallel. Hereinafter, for convenience of description, it will be described that one battery cell 10 is included in the battery pack 1.

In addition, the battery cell 10 may be electrically connected in series with the main relay 20.

For example, referring to FIG. 4, the main relay 20 may be connected in series between a positive electrode terminal of the battery cell 10 and the positive electrode terminal P+ of the battery pack 1. That is, the main relay 20 may be disposed on a main charging and discharging path of the battery pack 1. Here, the main charging and discharging path may be a path of a high current flowing through the battery pack 1. That is, the main charging and discharging path may be a path connecting the positive electrode terminal P+ of the battery pack 1, the main relay 20, the battery cell 10, and the negative electrode terminal P− of the battery pack 1.

If the circuit diagnosing apparatus 100 according to an embodiment of the present disclosure is provided to the battery pack 1, the circuit diagnosing apparatus 100 may diagnose a circuit state of the battery pack 1.

Referring to FIG. 3, the circuit diagnosing apparatus 100 according to an embodiment of the present disclosure may include a control unit 110 and a DC-DC converter 120.

The control unit 110 may be configured to output a first signal having a preset duty cycle through a first line L1 connected to the main relay 20 according to a predetermined output frequency. That is, the first signal may be a pulse width modulation (PWM) signal generated by the control unit 110.

Figure 2:
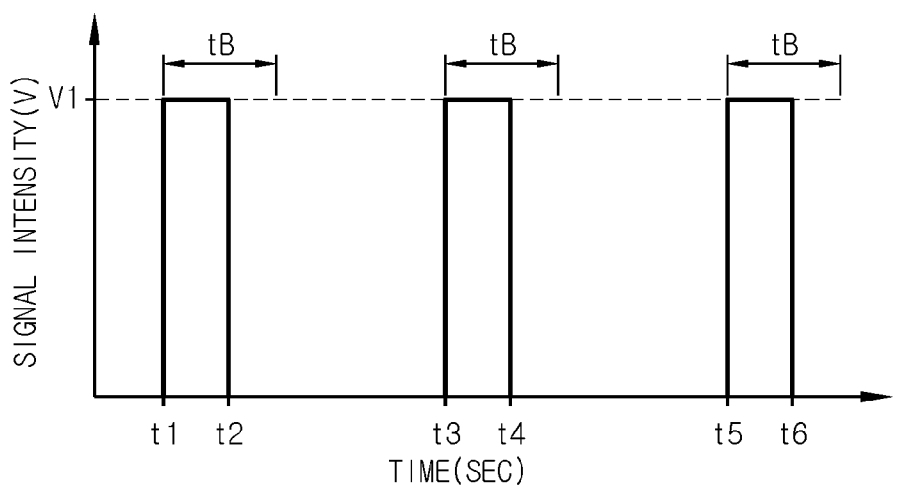
FIG. 2 is a diagram showing an example of a blank time of an HSD IC in a battery pack of the first comparative example.

Here, the duty cycle is a value representing the ratio of a pulse width to the period of the pulse, and the unit may be %. For example, in FIG. 2, the pulse period may be time t1 to t3, and the pulse width may be time t1 to t2.

Preferably, the control unit 110 may preset the duty cycle to any one of 0.2% to 99.8%. More preferably, the control unit 110 may preset the duty cycle to any one of 0.2% to 20%.

In addition, the output frequency may be a frequency related to a period in which the control unit 110 outputs the first signal. For example, in FIG. 2, the output frequency is a frequency that is inversely proportional to the period of the pulse (time t1 to t3), and the unit may be Hz.

Preferably, the control unit 110 may select an output frequency as any one of 1 Hz to 800 Hz. More preferably, the control unit 110 may select an output frequency as any one of 500 Hz to 800 Hz.

For example, in the embodiment of FIG. 4, the main relay 20 and the control unit 110 may be electrically connected through the first line L1. Accordingly, the first signal output from the control unit 110 to the first line L1 may be input to the main relay 20. That is, if the control unit 110 outputs the first signal having a preset duty cycle through the first line L1 according to the selected output frequency, the output first signal may be input to the main relay 20.

The DC-DC converter 120 may be configured to be further connected to the first line L1.

Specifically, the first line L1 connecting the main relay 20 and the control unit 110 may be branched and connected to the DC-DC converter 120.

For example, in the embodiment of FIG. 4, the first line L1 may be branched into a first unit line and a second unit line based on a branch point BP. Here, the first unit line may be a unit line connecting the branch point BP of the first line L1 and the main relay 20, and the second unit line may be a unit line connecting the branch point BP of the first line L1 and the DC-DC converter 120. The DC-DC converter 120 may be configured to be connected to the first line L1 by being connected to the second unit line.

The DC-DC converter 120 may be configured to receive the first signal through the first line L1.

Specifically, the first signal output to the first line L1 by the control unit 110 may be transmitted through the first unit line and the second unit line based on the branch point BP. That is, the first signal may be transmitted from the control unit 110 to the main relay 20 through the first line L1 and the first unit line, and may be transmitted from the control unit 110 to the DC-DC converter 120 through the first line L1 and the second unit line.

For example, in the embodiment of FIG. 4, the first signal output from the control unit 110 to the first line L1 may be input to both the main relay 20 and the DC-DC converter 120.

The DC-DC converter 120 may be configured to receive a second signal output from the battery cell 10 whenever an operation state of the main relay 20 is shifted to a turn-on state by the first signal. That is, the first signal may be a signal output from the control unit 110 to control the operation state of the main relay 20.

For example, it is assumed that the first signal output from the control unit 110 is the same as the signal shown in FIG.

2. When the signal has an intensity of V1 [V], the operation state of the main relay 20 may be controlled to a turn-on state, and when the signal has an intensity of is 0 [V], the operation state of the main relay 20 may be controlled to a turn-off state.

Therefore, if the control unit 110 outputs the first signal according to the output frequency, the operation state of the main relay 20 may be alternately shifted to a turn-on state and a turn-off state. In addition, only when the operation state of the main relay 20 is shifted to a turn-on state, the current output from the battery cell 10 may pass through the main relay 20.

In addition, the DC-DC converter 120 may be connected to the main charging and discharging path through a second line L2. For example, in the embodiment of FIG. 4, the DC-DC converter 120 may be connected to the second line L2 connected between the main relay 20 and the positive electrode terminal P+ of the battery pack 1. Therefore, whenever the operation state of the main relay 20 is shifted to a turn-on state, the DC-DC converter 120 may receive the second signal output from the battery cell 10 through the second line L2.

The DC-DC converter 120 may be configured to convert the first signal and the second signal.

The DC-DC converter 120 is a component that converts the magnitude of direct current (DC), and may convert the magnitudes of the first signal and the second signal.

In addition, the DC-DC converter 120 may be configured to transmit the first conversion signal and the second conversion signal obtained by the conversion to the control unit 110.

Specifically, the DC-DC converter 120 may be electrically connected to the control unit 110 through a wired line. More preferably, the DC-DC converter 120 may be electrically connected to the control unit 110 through a plurality of wired lines.

In addition, the DC-DC converter 120 may transmit the first conversion signal and the second conversion signal to the control unit 110 by outputting the first conversion signal and the second conversion signal to the wired line. Here, the signal output from the DC-DC converter 120 may be a digital signal.

For example, in the embodiment of FIG. 4, the DC-DC converter 120 may be connected to the control unit 110 through a third line L3 and a fourth line L4. In addition, the DC-DC converter 120 may output the first conversion signal through the third line L3 and output the second conversion signal through the fourth line L4.

The control unit 110 may be configured to receive the first conversion signal and the second conversion signal from the DC-DC converter 120.

Specifically, the control unit 110 may receive the first conversion signal, which is a digital signal, and the second conversion signal, which is a digital signal, from the DC-DC converter 120. For example, in the embodiment of FIG. 4, the control unit 110 may receive the first conversion signal and the second conversion signal through the third line L3 and the fourth line L4, respectively.

Also, the control unit 110 may be configured to determine whether the first conversion signal and the second conversion signal are the same.

For example, the control unit 110 may compare at least one of intensities, frequencies and duty cycles of the first conversion signal and the second conversion signal to determine whether the first conversion signal and the second conversion signal are the same.

Finally, the control unit 110 may be configured to determine whether the battery pack 1 has a defect based on the determination result. That is, the control unit 110 may determine whether the battery pack 1 has a defect based on a result of determining whether the first conversion signal and the second conversion signal are the same.

Figure 1:
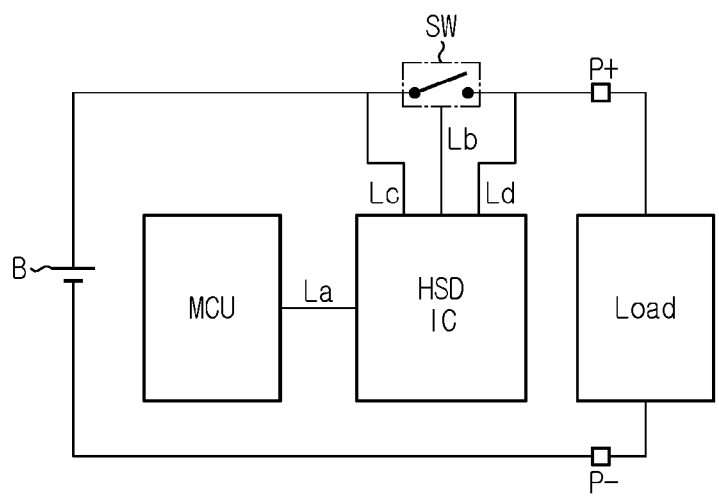
FIG. 1 is a diagram schematically showing a first comparative example.

Referring to FIGS. 1 and 4, when the present disclosure is compared with the prior art, in the prior art, whether a defect occurs at the battery pack 1 is determined based only on a signal output from a battery.

Referring to FIG. 1, the MCU determined whether a defect occurs at the battery pack 1 according to a difference between voltages at both ends of the main switch SW, based on a signal output from the battery. That is, in the prior art, it is determined whether a defect occurs at the battery pack 1 according to whether there is a difference in voltage before and after the signal output from the battery passes through the main switch SW.

However, referring to FIG. 4, the circuit diagnosing apparatus 100 may determine whether a defect occurs at the battery pack 1 based on a result of comparing the first signal output from the control unit 110 and the second signal output from the battery cell 10.

That is, the first signal output from the control unit 110 and the second signal output from the battery cell 10 are independent signals that do not affect each other. Therefore, the circuit diagnosing apparatus 100 according to an embodiment of the present disclosure has an advantage of more objectively and accurately determining whether a defect occurs at the battery pack 1 by comparing the signals output from different subjects, namely the control unit 110 and the battery cell 10.

Meanwhile, the control unit 110 included in the circuit diagnosing apparatus 100 may optionally include a processor, an application-specific integrated circuit (ASIC), another chipset, a logic circuit, a register, a communication modem, and a data processing device, and the like, known in the art to execute various control logics disclosed below. In addition, when the control logic is implemented in software, the control unit 110 may be implemented as a set of program modules. At this time, the program module may be stored in a memory and executed by the control unit 110. The memory may be provided in or out of the control unit 110, and may be connected to the control unit 110 by various well-known means.

Preferably, the DC-DC converter 120 may be configured to convert the voltage magnitudes of the first signal and the second signal into the same size.

The DC-DC converter 120 may maintain the duty cycles and frequencies of the first signal and the second signal as they are and convert only the voltage magnitudes of the first signal and the second signal into the same size. That is, the first conversion signal and the second conversion signal may be signals having the same intensity.

For example, in the embodiment of FIG. 4, the first signal is a signal output from the control unit 110, and the second signal is a signal output from the battery cell 10. Since the control unit 110 cannot output a signal having the same intensity as the battery cell 10, the DC-DC converter 120 may convert the intensities of the first signal and the second signal equally.

In addition, the control unit 110 may be configured to determine whether the first conversion signal and the second conversion signal are the same by comparing at least one of duty cycles and frequencies of the first conversion signal and the second conversion signal.

For example, the control unit 110 may determine whether the first conversion signal and the second conversion signal are the same signal by comparing duty cycles of the first conversion signal and the second conversion signal with each other. As another example, the control unit 110 may determine whether the first conversion signal and the second conversion signal are the same signal by comparing frequencies of the first conversion signal and the second conversion signal with each other. As still another example, more preferably, the control unit 110 may determine whether the first conversion signal and the second conversion signal are the same signal by comparing both frequencies and duty cycles of the first conversion signal and the second conversion signal.

That is, since the intensities of the first conversion signal and the second conversion signal become the same by the DC-DC converter 120, the control unit 110 may determine whether the first conversion signal and the second conversion signal are the same by comparing at least one of the duty cycle and the frequency.

Therefore, since the circuit diagnosing apparatus 100 according to an embodiment of the present disclosure equally converts the intensities of the first signal and the second signal output from different objects into the same size through the DC-DC converter 120, there is an advantage of minimizing the influence of the signal intensity when determining whether the first conversion signal and the second conversion signal are the same. In other words, since the circuit diagnosing apparatus 100 adjusts one of independent variables (signal intensity) for determining whether a defect occurs at the battery pack 1 into the same, there is an advantage of determining whether a defect occurs at the battery pack 1 based on the remaining independent variables (duty cycle and frequency). Therefore, by the process of converting the intensities of the signals to the same, there is an advantage of more accurately and precisely determining whether a defect occurs at the battery pack 1.

In addition, the DC-DC converter 120 may be configured to output the first conversion signal and the second conversion signal to the control unit 110 in the form of a digital signal.

Figure 5:
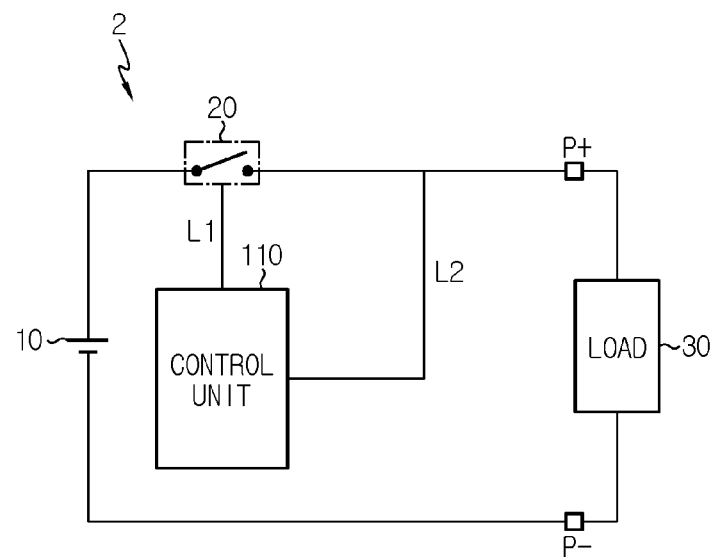
FIG. 5 is a diagram schematically showing a second comparative example.

FIG. 5 is a diagram schematically showing a second comparative example. Specifically, FIG. 5 is a diagram showing a second comparative example in which an analog signal is directly input to the control unit 110.

Referring to FIG. 5, the control unit 110 may be connected to the main relay 20 through the first line L1 to output the first signal. In addition, the control unit 110 may be directly connected to the main charging and discharging path through the second line L2 to receive the second signal from the battery cell 10. Here, the second signal is an analog signal.

If an analog signal is directly applied to the control unit 110 as shown in FIG. 5, a separate unit for converting the analog signal into a digital signal must be provided in the control unit 110. For example, an Analog-to-Digital Converter (ADC) and the DC-DC converter 120 must be separately provided in the control unit 110. In addition, in order to convert the input analog signal into a digital signal, the control unit 110 may increase the workload rapidly.

Accordingly, if the second signal, which is an analog signal, is directly input to the control unit 110 as shown in FIG. 5, there is a problem that a lot of time and system resources may be inefficiently consumed in converting the second signal to a digital signal.

In addition, the first signal is a signal output from the control unit 110, and the second signal is a signal output from the battery cell 10. Therefore, the first signal and the second signal may have very different signal intensities. Therefore, the difference in the intensity of the signals may affect the control unit 110 in diagnosing whether a defect occurs at a battery pack 2. For example, if the intensity of the second signal is greater than an allowable intensity that can be input to the control unit 110, the control unit 110 may be damaged by the second signal.

Accordingly, the circuit diagnosing apparatus 100 according to an embodiment of the present disclosure has an advantage of solving the above-described problem by converting the intensities of the first signal and the second signal to the same through the DC-DC converter 120. In addition, preferably, the DC-DC converter 120 may prevent the control unit 110 from being damaged due to the input of the second signal by converting the intensities of the first signal and the second signal to be less than the allowable intensity that can be input to the control unit 110.

The control unit 110 may be configured to determine that the battery pack 1 has no defect if it is determined that the first conversion signal and the second conversion signal are the same.

Conversely, the control unit 110 may be configured to determine that the battery pack 1 has a defect if it is determined that the first conversion signal and the second conversion signal are not the same.

Specifically, the second signal is a signal that is output from the battery cell 10 and input to the DC-DC converter 120 through the main relay 20 when the operation state of the main relay 20 is shifted to a turn-on state by the first signal.

For example, the operation state of the main relay 20 may be shifted to a turn-on state only when a high level signal included in the first signal is input to the main relay 20. That is, the main relay 20 may be shifted to a turn-on state only during the duty cycle of the first signal.

In addition, only when the operation state of the main relay 20 is a turn-on state, the second signal output from the battery cell 10 may pass through the main relay 20 and be input to the DC-DC converter 120.

As a result, the duty cycle and frequency of the second signal input to the DC-DC converter 120 may be the same as the duty cycle and frequency of the first signal input to the DC-DC converter 120. In addition, since the intensities of the first signal and the second signal are equally converted by the DC-DC converter 120, the duty cycles and frequencies of the first conversion signal and the second conversion signal may be the same if there is no defect in the battery pack 1. That is, if there is no defect in the battery pack 1, the first conversion signal and the second conversion signal may be the same signal. Therefore, the control unit 110 may determine that the battery pack 1 has no defect if the first conversion signal and the second conversion signal are the same.

The case where the battery pack 1 has a defect will be described as an example. In the embodiment of FIG. 4, it is assumed that a short circuit occurs in a node between the positive electrode terminal P+ of the battery pack 1 and the load 30. In particular, it is assumed that a short to ground (STG) occurs in the node between the positive electrode terminal P+ of the battery pack 1 and the load 30. In this case, the intensity of the second signal may be 0 [V]. In addition, the duty cycle of the second signal may be 0%, and the frequency may be 0 Hz. In this case, since the DC-DC converter 120 cannot change the intensity of the second signal, the control unit 110 cannot determine that the first conversion signal and the second conversion signal are the same. Therefore, the control unit 110 may determine that the battery pack 1 has a defect.

In addition, in the embodiment of FIG. 4, even if a short to battery (STB) occurs at the node between the positive electrode terminal P+ of the battery pack 1 and the load 30 or the node is disconnected (Open line, OL), the intensity of the second signal may be 0 [V]. Therefore, the control unit 110 may diagnose whether the battery pack 1 has a defect even in the case of STB defect and OL defect as well as STG defect.

The circuit diagnosing apparatus 100 according to an embodiment of the present disclosure may control the duty cycle and frequency of the second signal by controlling the operation state of the main relay 20 according to the first signal. In other words, by controlling the operation state of the main relay 20, the circuit diagnosing apparatus 100 may convert the signal output from the battery cell 10 into a pulse width modulated (PWM) signal (the second signal) even if there is no separate configuration for converting the signal output from the battery cell 10 into a pulse width modulation signal. In addition, the circuit diagnosing apparatus 100 may more accurately determine whether a defect occurs at the battery pack 1 according to the first conversion signal and the second conversion signal whose intensities are converted to the same size.

Hereinafter, a circuit configuration of the circuit diagnosing apparatus 100 and the battery pack 1 including the circuit diagnosing apparatus 100 according to an embodiment of the present disclosure will be described in more detail with reference to FIG. 4.

The main relay 20 may include a first relay terminal connected to the battery cell 10; a second relay terminal connected to the control unit 110 through the first line L1; and a third relay terminal connected to the DC-DC converter 120.

Preferably, the main relay 20 may be a field effect transistor (PET). More preferably, the main relay 20 may be a metal-oxide semiconductor field effect transistor (MOS-FET).

For example, if the main relay 20 is an N-channel MOSFET, the first relay terminal may be a drain terminal, the second relay terminal may be a gate terminal, and the third relay terminal may be a source terminal.

As another example, if the main relay 20 is a P-channel MOSFET, the first relay terminal may be a source terminal, the second relay terminal may be a gate terminal, and the third relay terminal may be a drain terminal.

Accordingly, the control unit 110 may be configured to set the intensity of the first signal according to the type of the main relay 20 so that the first relay terminal and the third relay terminal of the main relay 20 may be electrically connected with each other when the first signal is applied.

The DC-DC converter 120 may include a first input terminal i1, a second input terminal i2, a first output terminal O1, and a second output terminal O2.

Referring to FIG. 4, the first input terminal i1 may be connected to the first line L1. Specifically, the first input terminal i1 may be connected to the second unit line branched from the first line L1. In addition, the first input terminal i1 may receive the first signal output from the control unit 110 through the first line L1.

The second input terminal i2 may be connected to the second line L2. For example, in the embodiment of FIG. 4, the second line L2 may be connected between the main relay 20 and the load 30. In addition, the second input terminal i2 may receive the second signal output from the battery cell 10 through the second line L2. In particular, the second input terminal i2 may receive the second signal only when the operation state of the main relay 20 is a turn-on state.

That is, the DC-DC converter 120 may include the first input terminal i1 for receiving the first signal and the second input terminal i2 for receiving the second signal separately so that the first signal and the second signal do not interfere with each other.

The first output terminal O1 may be connected to the third line L3. In addition, the DC-DC converter 120 may output the first conversion signal to the third line L3 through the first output terminal O1. The output first conversion signal may be input to the control unit 110.

The second output terminal O2 may be connected to the fourth line L4. In addition, the DC-DC converter 120 may output the second conversion signal to the fourth line L4 through the second output terminal O2. The output second conversion signal may be input to the control unit 110.

That is, the DC-DC converter 120 may include the first output terminal O1 for outputting the first conversion signal and the second output terminal O2 for outputting the second conversion signal separately so that the first conversion signal and the second conversion signal do not interfere with each other.

The second line L2 may be electrically connected to the third relay terminal.

Preferably, the second line L2 may be connected to the main charging and discharging path directly connected to the third relay terminal. Therefore, after the second signal output from the battery cell 10 passes through the main relay 20, the second signal may be input to the second input terminal i2 of the DC-DC converter 120 through the second line L2.

Referring to FIG. 4, objects that output signals to be input to the first input terminal i1 and the second input terminal i2 are different from each other. Specifically, the object of outputting the first signal input to the first input terminal i1 is the control unit 110, and the object of outputting the second signal input to the second input terminal i2 is the battery cell 10. In addition, since the first signal is a signal generated and output by the control unit 110 itself, the first signal is not affected by whether a defect occurs at the battery pack 1.

Therefore, the circuit diagnosing apparatus 100 according to an embodiment of the present disclosure has an advantage of more accurately determining whether a defect occurs at the battery pack 1 based on the first signal that is not affected by whether a defect occurs at the battery pack 1 and the second signal that is affected by whether a defect occurs at the battery pack 1.

Figure 6:
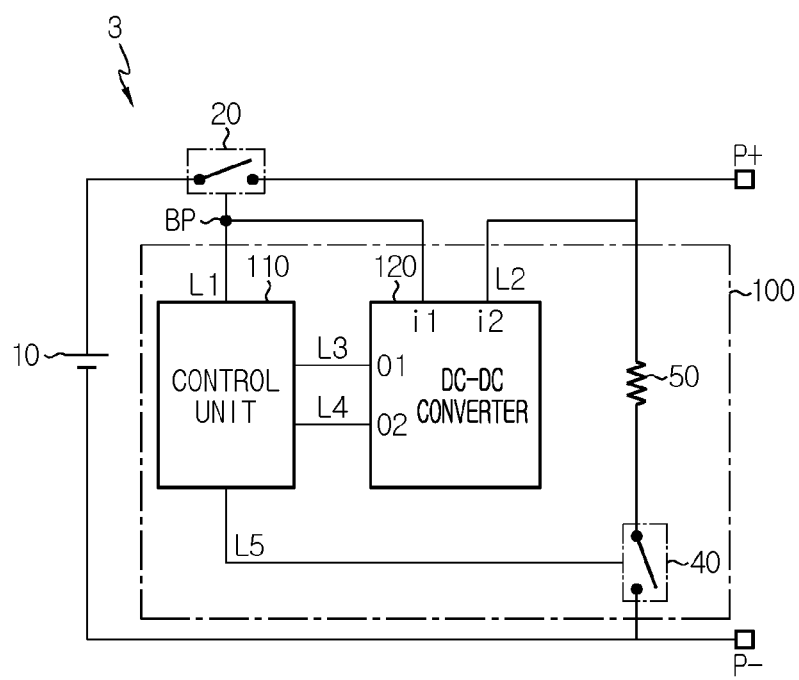
FIG. 6 is a diagram showing an exemplary configuration of a battery pack including a circuit diagnosing apparatus according to another embodiment of the present disclosure.

FIG. 6 is a diagram showing an exemplary configuration of a battery pack 3 including a circuit diagnosing apparatus 100 according to another embodiment of the present disclosure.

Referring to FIG. 6, a circuit diagnosing apparatus 100 according to another embodiment of the present disclosure may further include a diagnosis line. That is, a battery pack 3 of FIG. 6 may further include the diagnosis line, compared to the battery pack 1 of FIG. 4. Hereinafter, features identical to the above description will not be described again.

The diagnosis line may be a line connected to the battery cell 10 in parallel.

In addition, the diagnosis line may be a line on which a diagnosis resistor 50 and a diagnosis relay 40 connected in series are disposed. That is, the diagnosis resistor 50 and the diagnosis relay 40 disposed on the diagnosis line may be connected to the battery cell 10 in parallel.

Referring to FIG. 6, the battery cell 10, the main relay 20, the diagnosis resistor 50 and the diagnosis relay 40 may form a closed circuit. That is, the diagnosis line may be a line constituting a self-discharge path of the battery cell 10. In addition, the main relay 20, the diagnosis resistor 50 and the diagnosis relay 40 may be disposed on the self-discharge path of the battery cell 10.

The control unit 110 may be configured to be connected to the diagnosis relay 40 via a fifth line L5.

In addition, the control unit 110 may be configured to control the operation state of the diagnosis relay 40 through the fifth line L5.

Specifically, the control unit 110 may control the operation state of the diagnosis relay 40 by outputting a turn-off command signal or a turn-on command signal to the fifth line L5.

The control unit 110 may be configured to control the operation state of the diagnosis relay 40 to a turn-on state through the fifth line L5 and then output the first signal to the main relay 20.

If the control unit 110 outputs the turn-on command signal through the fifth line L5 and output the first signal through the first line L1, the operation states of both the diagnosis relay 40 and the main relay 20 may be shifted to a turn-on state.

Specifically, the operation state of the main relay 20 may be shifted to a turn-on state only during the duty cycle of the first signal. That is, during the duty cycle of the first signal, the closed circuit including the battery cell 10, the main relay 20, the diagnosis resistor 50 and the diagnosis relay 40 may be electrically connected.

The second signal may be configured to flow through the diagnosis line if the operation states of the diagnosis relay 40 and the main relay 20 are controlled to a turn-on state.

That is, if the battery cell 10, the main relay 20, the diagnosis resistor 50 and the diagnosis relay 40 are electrically connected, the second signal may be output from the battery cell 10. In addition, the output second signal may be input to the DC-DC converter 120 through the second line L2. Specifically, in the embodiment of FIG. 6, the second signal may be input to the second input terminal i2 of the DC-DC converter 120.

After that, the control unit 110 may determine whether a defect occurs at the battery pack 3 by outputting the first signal according to a predetermined output frequency while maintaining the operation state of the diagnosis relay 40 as a turn-on state.

That is, since the circuit diagnosing apparatus 100 according to another embodiment of the present disclosure includes the self-discharge path of the battery cell 10, there is an advantage of always determining whether a defect occurs at the battery pack 3 by the circuit diagnosing apparatus 100 even if the load 30 is not connected to the battery pack 3.

In addition, if it is determined that a defect occurs at the battery pack 1, 3, the control unit 110 according to the present disclosure may prevent the battery pack 1, 3 having a defect from causing unexpected accidents in advance by maintaining the operation state of the main relay 20 as a turn-off state.

The circuit diagnosing apparatus 100 according to the present disclosure may be applied to a BMS (Battery Management System). That is, the BMS according to the present disclosure may include the circuit diagnosing apparatus 100 described above. In this configuration, at least some of the components of the circuit diagnosing apparatus 100 may be implemented by supplementing or adding functions of components included in a conventional BMS. For example, the control unit 110 and the DC-DC converter 120 of the circuit diagnosing apparatus 100 may be implemented as components of the BMS.

In addition, the circuit diagnosing apparatus 100 according to the present disclosure may be provided to a battery pack 1, 3. That is, the battery pack 1, 3 according to the present disclosure may include the circuit diagnosing apparatus 100 described above and at least one battery cell 10. In addition, the battery pack 1, 3 may further include electrical equipment (a relay, a fuse, etc.), a case, and the like.

The embodiments of the present disclosure described above are not necessarily implemented by an apparatus and method but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS 1, 2, 3: battery pack
10: battery cell
20: main relay
30: load
40: diagnosis relay
50: diagnosis resistor
100: circuit diagnosing apparatus
110: control unit
120: DC-DC converter
B: battery
SW: main switch

What is claimed is:

1. A circuit diagnosing apparatus for diagnosing a battery pack including a battery cell and a main relay connected in series, the circuit diagnosing apparatus comprising:
    a control unit configured to output a first signal of a preset duty cycle through a first line connected to the main relay; and
    a DC-DC converter, connected to the first line, configured to:
        receive the first signal through the first line;
        receive a second signal output from the battery cell in response to the first signal changing an operation state of the main relay to a turn-on state;
        convert the first signal and the second signal; and
        transmit a first conversion signal and a second conversion signal obtained by the conversion to the control unit;
    wherein the control unit is configured to:
        receive the first conversion signal and the second conversion signal from the DC-DC converter;

determine whether the first conversion signal and the second conversion signal include one or more common signal properties; and determine whether the battery pack has a defect based on the determination of whether the first conversion signal and the second conversion signal include one or more common signal properties.

2. The circuit diagnosing apparatus according to claim 1, wherein the DC-DC converter is configured to convert voltage magnitudes of the first signal and the second signal to a same size.

3. The circuit diagnosing apparatus according to claim 1, wherein the one or more common signal properties includes at least one of a duty cycle or a frequency of the first conversion signal and the second conversion signal.

4. The circuit diagnosing apparatus according to claim 3, wherein the control unit is configured to:

determine that the battery pack has no defect, in response to the first conversion signal and the second conversion signal having one or more common signal properties, and determine that the battery pack has a defect, in response to the first conversion signal and the second conversion signal not having one or more common signal properties.

5. The circuit diagnosing apparatus according to claim 1, wherein the second signal is output from the battery cell and input to the DC-DC converter through the main relay in response to the operation state of the main relay being changed to the turn-on state by the first signal.

6. The circuit diagnosing apparatus according to claim 1, wherein the main relay includes:

a first relay terminal connected to the battery cell;

a second relay terminal connected to the control unit through the first line; and a third relay terminal connected to the DC-DC converter.

7. The circuit diagnosing apparatus according to claim 6, wherein the DC-DC converter includes:

a first input terminal connected to the first line to receive the first signal through the first line;

a second input terminal connected to a second line to receive the second signal through the second line;

a first output terminal connected to a third line to output the first conversion signal to the control unit through the third line; and a second output terminal connected to a fourth line to output the second conversion signal to the control unit through the fourth line.

8. The circuit diagnosing apparatus according to claim 7, wherein the second line is electrically connected to the third relay terminal.

9. The circuit diagnosing apparatus according to claim 8, further comprising:

a diagnosis line connected in parallel to the battery cell;

a diagnosis resistor disposed on the diagnosis line; and a diagnosis relay disposed on the diagnosis line in series with the diagnosis resistor, wherein the control unit is connected to the diagnosis relay through a fifth line to control an operation state of the diagnosis relay.

10. The circuit diagnosing apparatus according to claim 9, wherein the control unit is configured to:

change the operation state of the diagnosis relay to a turn-on state through the fifth line; and output the first signal to the main relay after changing the operation state of the diagnosis relay to the turn-on state, and wherein the second signal is configured to flow through the diagnosis line when the operation states of the diagnosis relay and the main relay are in the turn-on state.

11. The circuit diagnosing apparatus according to claim 1, wherein the control unit is configured to determine that the battery pack has a defect in response to the first and second conversion signals having at least one of a different duty cycle or a different frequency.

12. A battery pack, comprising the circuit diagnosing apparatus according to claim 1.

\* \* \* \* \*